(12) United States Patent
Shirazi et al.

(10) Patent No.: US 12,233,746 B2
(45) Date of Patent: Feb. 25, 2025

(54) METHOD AND SYSTEM FOR PREDICTING ENGINE-START PERFORMANCE OF AN ELECTRICAL ENERGY STORAGE SYSTEM

(71) Applicants: Clarios Germany GmbH & Co. KG, Hannover (DE); Clarios Advanced Solutions GmbH, Hannover (DE)

(72) Inventors: Sepehr Shirazi, Hannover (DE); Markus Hoh, Wunstorf (DE)

(73) Assignees: Clarios Germany GmbH & Co., KG, Hannover (DE); Clarios Advanced Solutions GmbH, Hannover (DE)

( * ) Notice: Subject to any disclaimer, the term of this patent is extended or adjusted under 35 U.S.C. 154(b) by 355 days.

(21) Appl. No.: 17/774,762

(22) PCT Filed: Aug. 25, 2020

(86) PCT No.: PCT/EP2020/073692
§ 371 (c)(1),
(2) Date: May 5, 2022

(87) PCT Pub. No.: WO2021/089214
PCT Pub. Date: May 14, 2021

(65) Prior Publication Data
US 2022/0388424 A1   Dec. 8, 2022

(30) Foreign Application Priority Data
Nov. 6, 2019   (DE) .......................... 102019129902.0

(51) Int. Cl.
*B60L 58/16*   (2019.01)
*B60R 16/033*   (2006.01)
(Continued)

(52) U.S. Cl.
CPC ............ *B60L 58/16* (2019.02); *B60R 16/033* (2013.01); *G01R 31/007* (2013.01); *G01R 31/3647* (2019.01); *G01R 31/392* (2019.01)

(58) Field of Classification Search
None
See application file for complete search history.

(56) References Cited

U.S. PATENT DOCUMENTS 6,417,668 B1 *   7/2002   Howard ................... H02J 7/14
324/426
7,061,246 B2   6/2006   Dougherty et al.
(Continued)

FOREIGN PATENT DOCUMENTS

| CN | 103906659 A | 7/2014 |
|----|-------------|--------|
| CN | 104471237 A | 3/2015 |

(Continued)

OTHER PUBLICATIONS

Written Opinion of the International Preliminary Examining Authority, Dated May 13, 2022, six pages.
(Continued)

*Primary Examiner* — Justin S Lee
(74) *Attorney, Agent, or Firm* — Boardman & Clark LLP

(57) ABSTRACT

The invention relates to a method for predicting an engine-start performance of an electrical energy storage system, in particular a motor vehicle starter battery. The method comprises the following method steps: generating engine-start data which are characteristic of the electrical energy storage system; evaluating the generated engine-start data; and outputting a result of the evaluation, which result relates to a prediction with respect to the engine-start performance of the electrical energy storage system. According to the invention, provision is made in particular for a vehicle make, a vehicle model and/or a vehicle variant of a vehicle to be started by the electrical energy storage system to be taken
(Continued)

Figure 1:
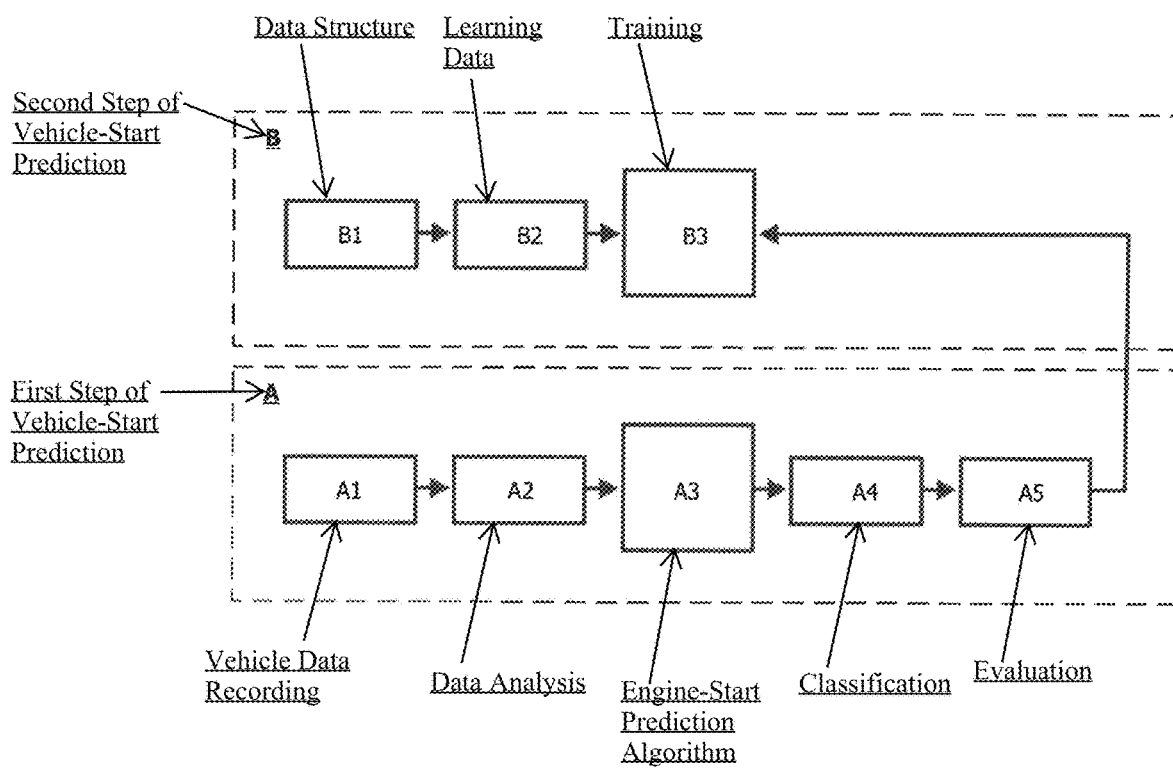

into account in order to evaluate the generated engine-start data.

16 Claims, 1 Drawing Sheet

(51) Int. Cl.
*G01R 31/00* (2006.01)
*G01R 31/36* (2020.01)
*G01R 31/392* (2019.01)

(56) References Cited

U.S. PATENT DOCUMENTS

| | | | |
|---|---|---|---|
| 2008/0183408 A1* | 7/2008 | Matsuura | G01R 31/367 |
| | | | 702/63 |
| 2008/0254347 A1* | 10/2008 | Palladino | H01M 10/48 |
| | | | 429/90 |
| 2009/0088994 A1* | 4/2009 | Machiyama | H01M 10/48 |
| | | | 702/63 |
| 2009/0217897 A1 | 9/2009 | Hartmann | |
| 2010/0026306 A1* | 2/2010 | Zhang | G01R 31/3647 |
| | | | 324/426 |
| 2013/0085696 A1 | 4/2013 | Xu et al. | |
| 2016/0011271 A1* | 1/2016 | Bertness | H01M 10/4285 |
| | | | 702/63 |
| 2016/0349330 A1* | 12/2016 | Barfield, Jr. | G01R 31/389 |
| 2019/0176639 A1* | 6/2019 | Kumar | B60L 3/0046 |
| 2020/0164763 A1* | 5/2020 | Holme | B60L 58/16 |

FOREIGN PATENT DOCUMENTS

| | | |
|---|---|---|
| DE | 39 01 680 A1 | 3/1990 |
| DE | 10 2018 0131626 A1 | 6/2019 |
| JP | 2011 069693 A | 4/2011 |
| JP | 2014 054083 A | 3/2014 |
| WO | 2021089214 A1 | 5/2021 |

OTHER PUBLICATIONS

International Preliminary Report on Patentability, Dated Oct. 15, 2021, 5 pages.

* cited by examiner

METHOD AND SYSTEM FOR PREDICTING ENGINE-START PERFORMANCE OF AN ELECTRICAL ENERGY STORAGE SYSTEM

CROSS REFERENCE TO RELATED APPLICATION

This application is a US national phase patent application of International Application No. PCT/EP/2020/073692, entitled "METHOD AND SYSTEM FOR PREDICTING ENGINE-START PERFORMANCE OF AN ELECTRICAL ENERGY STORAGE SYSTEM," filed Aug. 25, 2020, which claims priority to German Patent Application No. 102019129902.0, entitled "METHOD AND SYSTEM FOR PREDICTING ENGINE-START PERFORMANCE OF AN ELECTRICAL ENERGY STORAGE SYSTEM," filed Nov. 6, 2019, the entire content of each of which is hereby incorporated by reference herein in its entirety.

The present invention relates generally to methods and systems for estimating a state of an electrical energy storage system, such as estimating a remaining capacity of an electrical energy storage system, for example. Specifically, the invention relates to methods and systems for predicting an engine-start performance of an electrical energy storage system, in particular a motor vehicle starter battery.

The term "engine-start performance" used herein is to be understood as meaning the capability of the electrical energy storage system to be able to start, in particular to be able to cold-start or warm-start, a vehicle engine of a motor vehicle. In particular, the term "engine-start performance" also includes the capability of the electrical energy storage system to still be able to successfully carry out a specific number of starting processes of the vehicle engine.

Determining the state of an electrical energy storage system, in particular a vehicle, is becoming increasingly important with increasing vehicle functions that require electrical energy at least for support. Since more and more safety-relevant functions of the vehicle are receiving electrical support, the reliability of the state determination and state assessment of the energy storage system is becoming increasingly important.

In electrical energy storage systems having a number of rechargeable battery cells, the individual battery cells age over time, as a result of which the properties of the battery cells or of the entire electrical energy storage system change. In order to be able to reliably predict the remaining service life of the energy storage system (battery life) during operation and to identify aging processes in good time and be able to take appropriate measures, it is desirable to be able to determine the state of health of the electrical energy storage system as precisely as possible. Appropriate measures include by way of example replacing aged battery cells or the entire electrical energy storage system before their state becomes critical.

Known systems and methods for determining the state of the battery generally use direct measured values of the state of the battery and/or the properties of the battery, by means of which the state of the battery is determined.

For example, the publication DE 19 540 827 C2 specifies a method for determining the battery state, in which battery-specific characteristic maps of battery aging are used to determine a battery aging value from detected instantaneous values of the battery aging influencing variables with the aid of the characteristic map.

A method for determining a characteristic variable related to the state of charge of a storage battery is also known from the document DE 10 335 928 A1, for example, in which a first state of charge value based on the high voltage of the battery and a second state of charge value based on the amount of charge converted are determined. The two state of charge values are evaluated with regard to their changes in the state of charge in order to derive a characteristic variable for the state of the battery from the changes in the state of charge.

These known systems have the disadvantage that larger errors in the measured variables directly affect the output variable, and therefore the determination of the state of the energy storage system is not unambiguous or can be distorted.

In addition, there are battery test devices which can be used to predict the amount of charge that a rechargeable battery can store. The capacity that can be drawn from a battery depends on the discharge process, that is to say on the discharge current, on the end-of-discharge voltage (=the voltage at which the discharge is ended), and on the degree of discharge. The rechargeable battery has a different capacity depending on the discharge process. In a significant indication of the nominal capacity, both the discharge current and the end-of-discharge voltage must therefore be specified.

In general, the capacity that can be drawn from a battery decreases as the discharge current increases. This effect is described by the Peukert equation. Responsible for this is, among other things, the increasing voltage drop at the internal resistance of the battery as the current increases, which causes the output voltage to drop accordingly, with the result that the end-of-discharge voltage is reached earlier. In addition to the internal resistance, the limited speed of the electrochemical processes and charge transport processes in the battery is also responsible for the decreasing capacity thereof at an increased charging current.

Conventional battery test devices are based on measuring the internal resistance of the battery. Based on this measurement, it is possible to calculate a voltage value that the battery will assume if a defined discharge profile or a defined type of discharge is applied. Types of discharge that are considered are, for example, a discharge at a constant current, a discharge via a constant resistance or a discharge at a constant power.

As an alternative to this, it is possible to use the measured internal resistance of the battery to calculate a cold crank current and to define a threshold value at which the battery should be replaced. As an example of this, the threshold value could be 50% of the nominal cold crank current.

Cold crank current, often also called cold test current, is understood to be the maximum current that a battery can deliver at a temperature of −18° C. for 30 seconds before the battery voltage is too low. According to the German industrial standard (DIN), a fully charged 12 V battery is discharged down to 6 V at −18° C., but should still have at least 9 V after 30 seconds and only reach the 6 V limit after 150 seconds. According to the American standard (SAE), a fully charged battery should still have at least 7.2 V after 30 seconds of discharging at −18° C. According to the IEC (International Electrotechnical Commission), the battery should still have 8.4 V after 60 seconds at −18° C. Last but not least, according to the European standard (EN), the discharge time after a discharge at a final voltage of 7.5 V should be at least 10 seconds.

However, the conventional approaches for estimating or predicting a capacity which can be drawn from a battery are based on the assumption that the batteries are operated in a fully charged state. The boundary condition is generally no longer achievable, particularly in the case of start-stop batteries, since these batteries are generally operated in a partially charged state (typically at 70% to 80%).

In addition, conventional battery testers do not take battery degradation into account. The term "degradation" is to be understood as meaning the decrease in the capacity of a battery over time, even when used properly, with this decrease in capacity taking place as a result of chemical reactions (aging). On the one hand, the charging and discharging processes at the electrodes of a battery lead to (only partially reversible) electrochemical processes that prevent complete charging or discharging. In the case of lead-acid rechargeable batteries, this includes sulfation, in the case of batteries based on nickel technology, for example, battery inertia effects and in the case of batteries based on lithium chemistry, electrode aging due to irreversible parasitic chemical reactions (calendar lifespan).

Corresponding wear of the rechargeable battery in the course of use is the charging capacity and thus also the energy density.

Due to the increasing trend toward the use of so-called start-stop systems or automatic start-stop systems, the disadvantages discussed above in known systems for estimating the battery capacity are no longer acceptable. This is due in particular to the fact that, in start-stop systems, in order to reduce fuel consumption when stationary (for example when stopped at traffic lights), the engine switches off when at a standstill under certain conditions and starts again automatically. These start-stop systems therefore require special conditions for the start-stop batteries.

A start-stop battery performs almost the same tasks and functions as a regular car battery, but has to do a lot more, since the automatic start-stop system causes the combustion engine to switch on and off constantly, which demands maximum performance from the battery. It is therefore evident that a sufficiently functional battery is required for the automatic start-stop system to function properly.

The present invention is based on the object of specifying an optimized diagnosis and analysis pool in order to be able to predict a possible battery defect quickly and reliably, in particular also for start-stop batteries.

In particular, a method for estimating the state of health of a battery system and in particular for predicting an engine-start performance of a battery system, in particular a motor vehicle starter battery, is to be provided, using which the state of health of the battery system can be estimated as accurately as possible and in particular an engine-start performance of a battery system can be predicted as accurately as possible.

A further object of the invention is to provide a method which can be used on a large number of different energy storage systems and in particular battery systems and which also delivers reliable results under varying operating conditions of the energy storage system or battery system.

To solve this problem, a method according to independent patent claim 1 and a system according to independent patent claim 16 are specified according to the invention.

Accordingly, the subject of the invention is in particular a method for predicting an engine-start performance of an electrical energy storage system, in particular a motor vehicle starter battery, using which not only a specific state of health (SOH) of the energy storage system can be estimated, but also an engine-start performance of the energy storage system can be reliably predicted. For this purpose, provision is made according to the invention for engine-start data which are characteristic of the electrical energy storage system first to be generated. These generated engine-start data are evaluated accordingly and then a result of the evaluation, which result relates to a prediction with respect to the engine-start performance of the electrical energy storage system, is output. In particular, a vehicle make, a vehicle model and/or a vehicle variant of a vehicle to be started by the electrical energy storage system is/are taken into account in order to evaluate the generated engine-start data.

The basis of the method according to the invention thus forms the actual field of application of the electrical energy storage system which is examined with regard to the engine-start performance. This utilizes the knowledge that, depending on the respective area of use or application, an energy storage system still delivers a sufficient engine-start performance to be able to start a specific vehicle successfully, despite an advanced state of health. The term "specific vehicle" used herein is to be understood in particular as meaning a specific vehicle make, a specific vehicle model and/or a specific vehicle variant.

In other words, according to the invention, engine-start data which are characteristic of the electrical energy storage system which is examined with regard to the engine-start performance are generated in a large number of different application situations. The characteristic engine-start data are, for example, the voltage behavior in the energy storage system during an engine-start phase that occurs in a specific vehicle (that is to say in a specific vehicle make, in a specific vehicle model and/or in a specific vehicle variant).

In particular, the engine-start data which are characteristic of the electrical energy storage system comprise at least one engine-start voltage and/or at least one engine-start voltage profile of the electrical energy storage system during a start phase of a specific vehicle.

In one variant of this, the engine-start data which are characteristic of the electrical energy storage system comprise a temperature of the electrical energy storage system when the at least one engine-start voltage is generated and/or when the at least one engine-start voltage profile is generated.

As an alternative or in addition, the engine-start data which are characteristic of the electrical energy storage system comprise state of charge data of the electrical energy storage system when the at least one engine-start voltage is generated and/or when the at least one engine-start voltage profile is generated.

In principle, it is conceivable for the engine-start data which are characteristic of the electrical energy storage system to comprise for example at least one minimum value of a voltage of the electrical energy storage system during an engine start, an engine-start time which is dependent in particular on the state of charge of the electrical energy storage system, and/or a number of engine starts already carried out by the electrical energy storage system.

In this context, it is fundamentally advisable for the engine-start data which are characteristic of the electrical energy storage system to be generated by at least one sensor arranged in particular in the vehicle to be started by the electrical energy storage system. For example, it is thus conceivable for the engine-start data which are characteristic of the electrical energy storage system to be generated and/or provided by a (vehicle-internal) vehicle diagnostic system of the vehicle to be started by the electrical energy storage system for evaluation.

As an alternative or in addition, the engine-start data which are characteristic of the electrical energy storage system can be generated and/or provided by at least one sensor that is preferably galvanically connected directly to an electrical connection of the electrical energy storage system.

According to developments of the method according to the invention, provision is made for not only the vehicle to be started by the energy storage system which is examined (vehicle model, vehicle make and/or vehicle variant), but also the temperature or a temperature range of a vehicle engine to be started by the electrical energy storage system to be taken into account, with the output result of the evaluation relating to a prediction with respect to the engine-start performance of the electrical energy storage system at different temperatures of the vehicle engine.

For example, it is conceivable for the method according to the invention to be able to be used to predict what the engine-start performance of the electrical energy storage system looks like in the summer months or winter months.

The term "engine-start performance" of the electrical energy storage system used herein is generally to be understood as an indicator for a capability of the electrical energy storage system to be able to start, in particular to cold-start or warm-start, a vehicle engine of the vehicle make taken into account in the evaluation, the vehicle model taken into account in the evaluation and/or the vehicle variant taken into account in the evaluation. For example, the engine-start performance of the electrical energy storage system is indicative of a number of vehicle engine start processes which can still be carried out successfully by way of the electrical energy storage system.

According to the invention, a prediction model or aging model of the electrical energy storage system is created and/or continuously optimized on the basis of training data. For this purpose, the engine-start data are input into an engine-start prediction algorithm based on the principle of machine learning in order to evaluate the generated engine-start data. In the engine-start prediction algorithm, the engine-start data may be divided according to classifications into different categories, wherein the various patterns differ. In particular, in this case the engine-start data are divided into different categories depending on a vehicle make, a vehicle model and/or a vehicle variant of the vehicle to be started by the electrical energy storage system.

In the method according to the invention, provision is made in particular for a learning phase of the engine-start prediction algorithm to be carried out. In the learning phase, learning data are entered into the engine-start prediction algorithm, wherein the engine-start prediction algorithm identifies patterns and/or regularities in the input learning data according to the principle of machine learning, which patterns and/or regularities are used accordingly when evaluating the generated engine-start data. The learning data comprise in particular characteristic engine-start data for a large number of electrical energy storage systems, in particular those that have aged differently, from a large number of different vehicle makes, vehicle models and/or vehicle variants.

According to a preferred development, provision is made for the generated engine-start data of the electrical energy storage system whose engine-start performance is to be predicted to be used as learning data during a learning phase of the engine-start prediction algorithm.

The invention also relates to a system for predicting an engine-start performance of an electrical energy storage system, wherein the system comprises an input interface for inputting engine-start data which are characteristic of the electrical energy storage system and an evaluation device for evaluating the input engine-start data. In this case, the evaluation device is designed to take into account a vehicle make, a vehicle model and/or a vehicle variant of a vehicle to be started by the electrical energy storage system when evaluating the engine-start data. In particular, the evaluation device comprises an engine-start prediction algorithm based on the principle of machine learning.

An exemplary embodiment of the method according to the invention or the system according to the invention is described in more detail below with reference to the attached drawing.

In the drawing:

FIG. 1 schematically shows a flow chart of an exemplary embodiment of the method according to the invention.

Conventional battery test systems attempt to predict the ability of an energy storage system or of a battery to start a combustion engine. This is typically based on a measurement of the internal resistance (IR) of the energy storage system or of the conductivity. Based on this measurement, it is possible to calculate a voltage value that the energy storage system will have when a defined current profile is applied.

A second approach is to use the internal resistance of the energy storage system to calculate a so-called cold crank current (CCA) and to set a threshold value at which the energy storage system should be replaced (for example at 50% of the nominal CCA value). The disadvantage of conventional battery test devices can be seen in particular in the fact that the type of prediction only takes into account the performance of the energy storage system at a predefined current value under laboratory conditions and a fixed (estimated) threshold value, such as 50% of the nominal CCA value, for example. As such, conventional battery test devices are unable to reflect a "real" engine-start condition.

Considering all variations of vehicle makes and vehicle models, variations of battery temperatures and ambient temperatures, considering the influence of SOC variations, etc., conventional battery test methods or battery test devices can in practice only provide an insufficient prediction of the battery performance for a real engine-start process in a vehicle.

In particular, methods known from the prior art for predicting the battery performance do not take into account the main reason for a battery failure, which is an aging-related decrease in the performance of the battery for starting the combustion engine.

In contrast, according to the invention, a vehicle-based electrical power consumption during engine start is used in order to adapt the prediction of the engine-start performance of the energy storage system.

In particular, the present invention takes into account a discrepancy between current battery testers, which are developed to estimate the battery performance under laboratory conditions, and the actual battery power required to start the vehicle's internal combustion engine (for different vehicle makes, vehicle models, engine technologies such as diesel, gasoline, start/stop, etc.).

The method according to the invention, as shown schematically in FIG. 1, is based in principle on two combined methods.

The first step A of the method forms the basis for the vehicle start prediction algorithm. A large number of different vehicle makes and vehicle models are used for the implementation of method step A (for example 100 vehicles).

As indicated as block A1 "vehicle data recording", different voltage profiles recorded when the engine is started are used as input data, namely for a large number of batteries of different ages, at different temperatures and different SOC conditions.

In a second step (block A2—"data analysis"), an intelligent machine learning algorithm categorizes the different voltage profiles (for example minimum voltage, start time, number of successful engine starts, etc.) for different vehicle makes and vehicle models and defines performance limits for successful and unsuccessful engine start processes.

The great advantage of this method is that the engine-start reaction of the vehicle for different variations (vehicle makes and models, temperatures, SOC, etc.) can later be used in a battery tester for a battery change recommendation and not unknown battery-internal (chemical) reactions.

The battery test device can record the engine-start data of the combustion engine directly at the connection poles of the energy storage system or record these values at other points, for example at the vehicle's OBD port via the analog output pin.

The engine-start data are then input into an engine-start prediction algorithm based on the principle of machine learning in order to evaluate the generated engine-start data (block A3—"engine-start prediction algorithm").

In the engine-start prediction algorithm, the engine-start data are divided according to classifications into different categories, which differ in characteristic patterns (block A4—"classification"), with the engine-start data then being divided into different categories depending on a vehicle make, a vehicle model and/or a vehicle variant of the vehicle to be started by the electrical energy storage system (block A5—"evaluation").

Since a basic algorithm based on the basic principle of machine learning is required for a prediction that is as reliable as possible, it is advantageous if as much learning data as possible are made available to the algorithm.

For this purpose, a further method step (step B) is used, which requires a cloud-based data structure which contains all values defined by the first method step A. The idea is that a battery tester contains the basic algorithm in a first step and works with a beta version in a pilot or learning phase and collects further engine-start data in several passes, which are automatically sent to the cloud database.

Specifically, in FIG. 1, the cloud-based data structure is denoted by the reference symbol B1. Method step B is characterized in that a learning phase of an engine-start prediction algorithm is carried out, with learning data B2 being, input into the engine-start prediction algorithm in the learning phase, and with the engine-start prediction algorithm identifying patterns and/or regularities in the input learning data that are applied accordingly when evaluating the generated engine-start data (block B3—"training").

The learning data comprise in particular characteristic engine-start data for a large number of electrical energy storage systems, in particular those that have aged differently, from a large number of different vehicle makes, vehicle models and/or vehicle variants.

The generated engine-start data of the electrical energy storage system whose engine-start performance is to be predicted can then be used as learning data during a learning phase of the engine-start prediction algorithm.

A machine learning algorithm evaluates these new engine-start data and adjusts the display to optimize the engine-start prediction algorithm and its threshold values. From time to time (that is to say after a sufficient number of new engine-start data of different vehicle models), the "old" algorithm version is updated with an optimized version. The algorithm itself can be used/implemented in a battery tester unit and/or it could be used as a cloud-based algorithm.

In summary, the following can be stated:

According to the invention, engine-start data which are characteristic of the electrical energy storage system examined are first generated.

These engine-start data are preferably generated directly in the vehicle using appropriate sensors, such as sensors that are part of the vehicle diagnostic system, for example. The characteristic engine-start data are the "real" data which an energy storage system generates during the start process of a real combustion engine for different vehicle makes, vehicle models and vehicle variants. This case deals in particular with an engine-start voltage and/or an engine-start voltage profile, but the temperature of the electrical energy storage system when generating the engine-start voltage or the engine-start voltage profile can also be taken into account, as can a state of charge of the energy storage system during the engine-start phase.

In other words, the input data for an evaluation algorithm based on machine learning are by no means laboratory data from the energy storage system, but data that are recorded under real conditions, with particular consideration being given here for which vehicle make, which vehicle model and/or which vehicle variant the real engine-start data are generated.

The evaluation algorithm based on machine learning then divides the engine-start data, which serve as learning data, into different categories.

This provides an engine-start prediction algorithm which, based on a learning phase which is preferably carried out continuously or periodically, is regularly fed with new learning data in order to optimize its accuracy.

Using the evaluation algorithm formed in this way, energy storage systems can then be evaluated particularly precisely with regard to a specific vehicle model or a specific vehicle make and/or a specific vehicle variant, specifically with regard to the question of how the engine-start performance of the electrical energy storage system looks for the specific vehicle make, the specific vehicle model and/or the specific vehicle variant.

The invention is not limited to the method shown schematically in the drawing, but results from looking at all the features disclosed herein together.

The invention claimed is:

1. A method for predicting a capability of an electrical energy storage system to be able to start a vehicle engine of a specific vehicle make, a specific vehicle model and/or a specific vehicle variant, wherein the electrical energy storage system is a motor vehicle starter battery, and wherein the method comprises the following:

generating engine-start data, with at least one sensor electrically coupled to the electrical energy storage system, which are characteristic of the electrical energy storage system;

calculating a predicted start capability of the electrical energy storage system through application of the generated engine-start data to an engine-start prediction algorithm, positioned within an evaluation device, having historical engine start data for different vehicle make and vehicle models and comparison of the generated engine start data to the historical engine start data pursuant to a principle of machine learning; and outputting a result of the calculation to a display, which result relates to a prediction with respect to the capability of the electrical energy storage system to be able to start a vehicle engine of a specific vehicle make, a specific vehicle model and/or a specific vehicle variant based upon the calculation for an increased accuracy in the prediction, wherein the specific vehicle make, the specific vehicle model and/or the specific vehicle variant of a vehicle to be started by the electrical energy storage system is taken into account in order to calculate the generated engine-start data, wherein a temperature or a temperature range of a vehicle engine to be started by the electrical energy storage system is taken into account in order to calculate the generated engine-start data, and wherein the output result of the calculation relates to a prediction with respect to the capability of the electrical energy storage system to be able to start a vehicle engine of a specific vehicle make, a specific vehicle model and/or a specific vehicle variant at different temperatures of the vehicle engine; and further wherein the capability of the electrical energy storage system to be able to start a vehicle engine of a specific vehicle make, a specific vehicle model and/or a specific vehicle variant is a capability of the electrical energy storage system to be able to cold-start or warm-start a vehicle engine of the vehicle make taken into account in the calculation, the vehicle model taken into account in the calculation and/or the vehicle variant taken into account in the calculation.

2. The method as claimed in claim 1, wherein the engine-start data which are characteristic of the electrical energy storage system comprise at least one engine-start voltage and/or at least one engine-start voltage profile of the electrical energy storage system.

3. The method as claimed in claim 2, wherein the engine-start data which are characteristic of the electrical energy storage system comprise a temperature of the electrical energy storage system when the at least one engine-start voltage is generated and/or when the at least one engine-start voltage profile is generated; and/or wherein the engine-start data which are characteristic of the electrical energy storage system comprise state of charge data of the electrical energy storage system when the at least one engine-start voltage is generated and/or when the at least one engine-start voltage profile is generated.

4. The method as claimed in claim 1, wherein the engine-start data which are characteristic of the electrical energy storage system comprise at least one minimum value of a voltage of the electrical energy storage system during an engine start, an engine-start time which is dependent in particular on a state of charge of the electrical energy storage system, and/or a number of engine starts already carried out by the electrical energy storage system.

5. The method as claimed in claim 1, wherein the engine-start data which are characteristic of the electrical energy storage system are generated by the at least one sensor arranged in particular in the vehicle to be started by the electrical energy storage system.

6. The method as claimed in claim 1, wherein the engine-start data which are characteristic of the electrical energy storage system are generated and/or provided by a vehicle diagnostic system of the vehicle to be started by the electrical energy storage system for calculation, and/or wherein the engine-start data which are characteristic of the electrical energy storage system are generated and/or provided by the at least one sensor which is preferably galvanically connected directly to an electrical connection of the electrical energy storage system.

7. The method as claimed in claim 1, wherein the capability of the electrical energy storage system to be able to start a vehicle engine of a specific vehicle make, a specific vehicle model and/or a specific vehicle variant is indicative of a number of vehicle engine start processes which can still be carried out successfully by way of the electrical energy storage system.

8. The method as claimed in claim 1, wherein the engine-start data are input into the engine-start prediction algorithm based on a principle of machine learning in order to calculate the generated engine-start data.

9. The method as claimed in claim 1, wherein in order to calculate the generated engine-start data, the engine-start data are input into an engine-start data prediction algorithm, in which the engine-start data are divided according to classifications into different categories, which differ in characteristics patterns.

10. The method as claimed in claim 9, wherein the engine-start data are divided into different categories depending on a vehicle make, a vehicle model and/or a vehicle variant of the vehicle to be started by the electrical energy storage system.

11. The method as claimed in claim 1, wherein the method further comprises the method step of performing a learning phase of an engine-start prediction algorithm, wherein learning data are input into the engine-start prediction algorithm in the learning phase, and wherein the engine-start prediction algorithm identifies patterns and/or regularities in the input learning data, which patterns and/or regularities are used accordingly when calculating the generated engine-start data.

12. The method as claimed in claim 11, wherein the learning data comprise characteristic engine-start data for a large number of electrical energy storage systems, in particular those that have aged differently, from a large number of different vehicle makes, vehicle models and/or vehicle variants.

13. The method as claimed in claim 11, wherein the generated engine-start data of the electrical energy storage system whose engine-start performance is to be predicted are used as learning data during a learning phase of the engine-start prediction algorithm.

14. A system for predicting a capability of an electrical energy storage system to be able to start a vehicle engine of a specific vehicle make, specific vehicle model and/or a specific vehicle variant, wherein the electrical energy storage system is a motor vehicle starter battery, wherein the system comprises an input interface being an access for an input of generated engine-start data which are characteristic of the electrical energy storage system, the input interface comprising at least one sensor electrically coupled to the electrical energy storage system, and an evaluation device having a calculation of a predicted start capability of the electrical energy storage system through an engine-start prediction algorithm, housed in the evaluation device, having the generated engine-start data with respect to a learned engine-start data for an increased accuracy in the predicted start capability pursuant to a machine learning, wherein the evaluation device is designed to take into account a vehicle make, a vehicle model and/or a vehicle variant of a vehicle to be started by the electrical energy storage system when calculating the generated engine-start data, wherein a temperature or a temperature range of a vehicle engine to be started by the electrical energy storage system is taken into account in order to calculate the generated engine-start data, and wherein an output result of the calculation relates to a prediction with respect to the capability of the electrical energy storage system to be able to start a vehicle engine of a specific vehicle make, a specific vehicle model and/or a specific vehicle variant at different temperatures of the vehicle engine; and further wherein the capability of the electrical energy storage system to be able to start a vehicle engine of a specific vehicle make, a specific vehicle model and/or a specific vehicle variant is a capability of the electrical energy storage system to be able to cold-start or warm-start a vehicle engine of the vehicle make taken into account the calculation, the vehicle model taken into account in the calculation and/or the vehicle variant taken into account in the calculation.

15. The system as claimed in claim 14, wherein the evaluation device comprises the engine-start prediction algorithm based on a principle of machine learning.

16. The system as claimed in claim 14, wherein the system comprises an output interface for outputting a result of the calculation carried out by the evaluation device.

* * * * *